United States Patent
Gupta

(10) Patent No.: US 8,378,740 B2
(45) Date of Patent: Feb. 19, 2013

(54) TECHNIQUE TO MINIMIZE VDS MISMATCH DRIVEN VOLTAGE SWING VARIATION IN OPEN DRAIN TRANSMITTER

(75) Inventor: Nitin Gupta, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 90 days.

(21) Appl. No.: 12/980,724

(22) Filed: Dec. 29, 2010

(65) Prior Publication Data

US 2012/0169410 A1 Jul. 5, 2012

(51) Int. Cl.
*G05F 1/10* (2006.01)
(52) U.S. Cl. ...................................................... 327/543
(58) Field of Classification Search .................. None
See application file for complete search history.

(56) References Cited

U.S. PATENT DOCUMENTS

| | | | |
|---|---|---|---|
| 6,989,698 B2 * | 1/2006 | Jeong | 327/157 |
| 7,088,152 B2 * | 8/2006 | Kim | 327/108 |
| 7,646,219 B2 * | 1/2010 | Escobar-Bowser et al. | 326/66 |
| 7,768,326 B2 * | 8/2010 | Kaneko | 327/157 |

* cited by examiner

*Primary Examiner* — Lincoln Donovan
*Assistant Examiner* — Sibin Chen
(74) *Attorney, Agent, or Firm* — Hogan Lovells US LLP

(57) ABSTRACT

A switching circuit includes a source follower current mirror having an input, an output, a first source terminal, a bias terminal, and a second source terminal; a current source coupled to the input of the current mirror; an output terminal coupled to the output of the current mirror; a first bias transistor coupled to the first source terminal; a second bias transistor coupled to bias terminal of the current mirror; and a driver transistor coupled to the second source terminal. An input transistor in the current mirror is sized such that the input voltage is substantially independent of the supply voltage.

19 Claims, 3 Drawing Sheets

TECHNIQUE TO MINIMIZE VDS MISMATCH DRIVEN VOLTAGE SWING VARIATION IN OPEN DRAIN TRANSMITTER

BACKGROUND OF THE INVENTION

The present application relates to methods and apparatus for controlling transistors. The application further relates to but is not limited to methods of apparatus for controlling voltage swing variation in open drain transmitters.

Typical open drain transmitter architectures generate an accurate voltage swing using a defined tail current of a differentially coupled pair of transmitters. FIG. 1 shows an example of a typical open drain transmitter architecture. A typical open drain transmitter comprises open drain transmitter circuitry comprising a first and second N-channel transistor 122 and 123 which receives a data and a complement data input at their respective gates. A respective source for the first 122 and second 123 N-channel transistor is coupled to a drain connection of a third N-channel transistor 121. The third N-channel transistor 121 has a source connection coupled to ground. The third N-channel transistor 121 sets the current through the first and second N-channel transistors 122 and 123 forming driving transistors.

A respective drain connection of the first and second N-channel transistors 122 and 123 is coupled to a respective source connection of a fifth and sixth transistor 124 and 125 respectively. A respective gate connection of the fourth and fifth transistor 124 and 125 is coupled to a signal Vbias received from bias circuitry 110. A drain connection of the fourth transistor 124 is coupled to an output pad B 126 and a drain connection of the fifth transistor 125 is coupled to an output pad A 127. The output pad B and A 126 and 127 are respectively coupled to a first and second terminating resistor 131 and 132 which are coupled in series to a terminating voltage 133. The external resistors 131 and 132 and terminating voltage 133 form part of a receiver 130.

A gate connection of the third transistor 121 is coupled to a gate connection of a sixth transistor 111 which is part of biasing circuitry 110. A source of the sixth transistor 111 is coupled to ground and a drain connection of the sixth transistor 111 is coupled to a source connection of a seventh transistor 112 as well as to the gate connection of the sixth transistor 111. The seventh transistor 112 gate connection is coupled to a voltage VDD while the drain of the seventh transistor 112 is coupled to the source of an eighth transistor 114. A gate voltage of the eighth transistor 114 provides the Vbias signal to the fourth and fifth transistors 124 and 125 and is further coupled to a drain connection of the eighth transistor 114. The drain connection of the eighth transistor 114 is also coupled to a current source 116 which in turn is coupled to the voltage source VDD 115.

The first and second transistors 122 and 123 form a differential transistor pair which receives differential data at their respective gates. The current through these transistors is set by the third transistor 121 which forms a current mirror with the sixth transistor 111. The sixth transistor 111 and seventh transistor 112 set the current through the biasing circuitry 110 and determine the current provided by current source 116. This current in turn biases the eighth transistor 114 which provides a suitable bias voltage at the gates of the fourth and fifth transistors 124 and 125. The fourth and fifth transistors 124 and 125 are cascode transistors that are implemented to protect the driving transistors by preventing their exposure to a high termination voltage.

In a typical open drain transmitter architecture, the driver transistors 122 and 123 do not receive the full circuit voltage VDD as their gate source voltage. The driver transistors 122 and 123 are typically in a linear region and therefore their size must increase in order to provide the required voltage drop at pad B and pad A. This in turn slows down the switching operation of the circuit.

It has been proposed to remove the tail current source of current mirror transistors 111 and 121 in order to provide the full voltage drop of VDD across the gate source of the driver transistors. This results in the current through the driver transistors being controlled by the cascode transistors 124 and 125. This circuit attempts to have the drive current of the cascode transistors 124 and 125 equal to the drive current of the eighth transistor 114. However a difference between the drain source voltage VDS of the eighth transistor 114 and the VDS of the cascode transistors 124 and 125 may lead to a current mismatch due to a $\lambda$VDS factor. Additionally, the drain voltage of the eighth transistor 114 is highly dependent on process variations in the source voltage.

It has further been proposed to implement additional cascode transistors as an additional level between the cascode transistors 124 and 125 and pads A and B 126 and 127. This however may slow down the transmitter considerably and impact on the headroom of the circuit. Alternatively an operational amplifier may be used to implement an effective equalization of the drain voltages of the cascode transistors and biasing transistor 114. This design however is not a power/area optimized design and additionally requires an operational amplifier and additional circuitry for the operational amplifier compensation.

What is desired is embodiments of the invention that attempt to address the above limitations.

SUMMARY OF THE INVENTION

According to a first aspect, there is provided a circuit comprising: transmitting circuitry configured to output a differential signal; biasing circuitry configured to provide a bias signal to the transmitting circuitry; and control circuitry configured to adjust a drain voltage of the biasing circuitry responsive to a voltage source of the circuit.

The drain voltage may be substantially constant.

The control circuitry may be further configured to monitor the voltage source.

The control circuitry may be source-follower circuitry.

The biasing circuitry may comprise: a variable transistor; wherein the drain voltage is a drain voltage of the variable transistor.

The transmitting circuitry may comprise: a current setting transistor; wherein the bias signal biases the current setting transistor The current setting transistor may be configured to provide a drive current determined by a drive current of the biasing circuitry.

The drive current of the transmitting circuitry may be substantially equal to the drive current of the biasing circuitry.

The variable transistor may be adjusted such that the drain voltage of the variable transistor is substantially equal to a drain voltage of the current setting transistor.

The control circuit may comprise: a first transistor driven by the voltage source; a second transistor driven by the drain voltage of the biasing circuitry; the first and second transistor being further coupled to the bias signal.

The bias circuit may comprise: the variable transistor; a second transistor driven by the voltage source, the second transistor coupled to ground and to the variable transistor; and a current source configured to provide a drive current to the variable and second transistor.

The transmitting circuitry may comprise: a differential transistor driven by an input differential signal; and a cascode transistor pair driven by the bias signal for providing a bias current to the differential transistor pair; wherein the differential transistor pair are coupled to the cascode transistor pair and ground.

The cascode transistor pair may comprise the current setting transistor.

The circuit may be a transmitter.

According to a second aspect, there is provided an integrated circuit comprising: transmitting circuitry configured to output a differential signal; biasing circuitry configured to provide a bias signal to the transmitting circuitry; and control circuitry configured to adjust a drain voltage of the biasing circuitry responsive to a voltage source of the circuit.

According to a third aspect, there is provided a circuit comprising: transmitting means for outputting a differential signal; biasing means for providing a bias signal to the transmitting circuitry; and controlling means for adjust a drain voltage of the biasing circuitry responsive to a voltage source of the circuit.

BRIEF DESCRIPTION OF THE DRAWINGS

Embodiments of the invention will now be described by way of example only with reference to the accompanying drawings in which.

DETAILED DESCRIPTION

Figure 1:
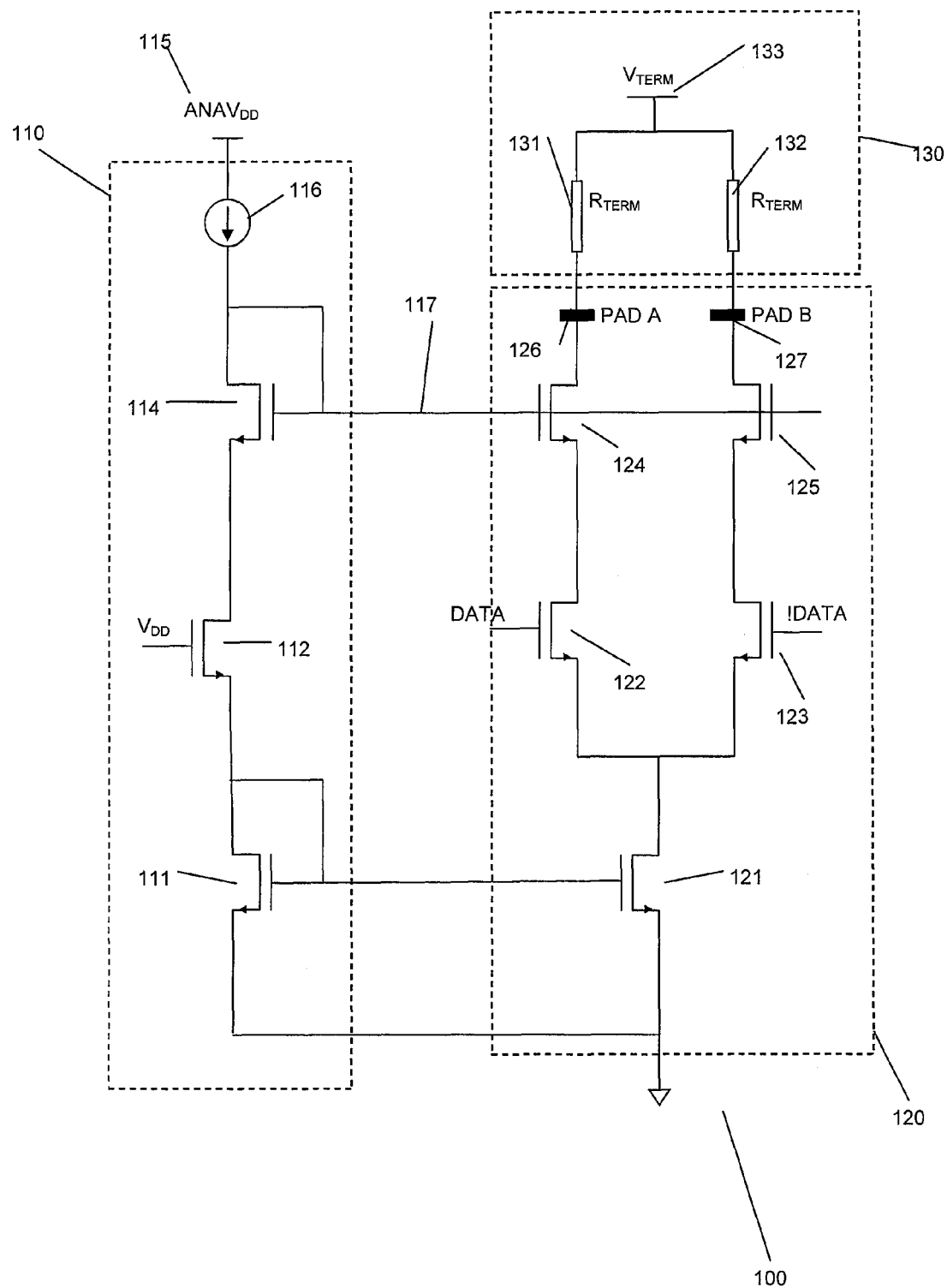
FIG. 1 shows an example of a known open drain transmitter architecture.

In the Figures described herein like reference numerals depict like features.

Embodiments may minimize or prevent a current mismatch by providing circuitry resulting in a drain voltage of a biasing transistor and a drain voltage of a cascode transistor being substantially equal. Additionally embodiments may reduce the dependence of a biasing drain and gate voltage on the source voltage and indemnify the biasing voltage against fluctuations in the source voltage VDD. In some embodiments the biasing gate voltage of the cascode transistors is adjusted such that it remains constant regardless of the value of VDD.

Figure 2:
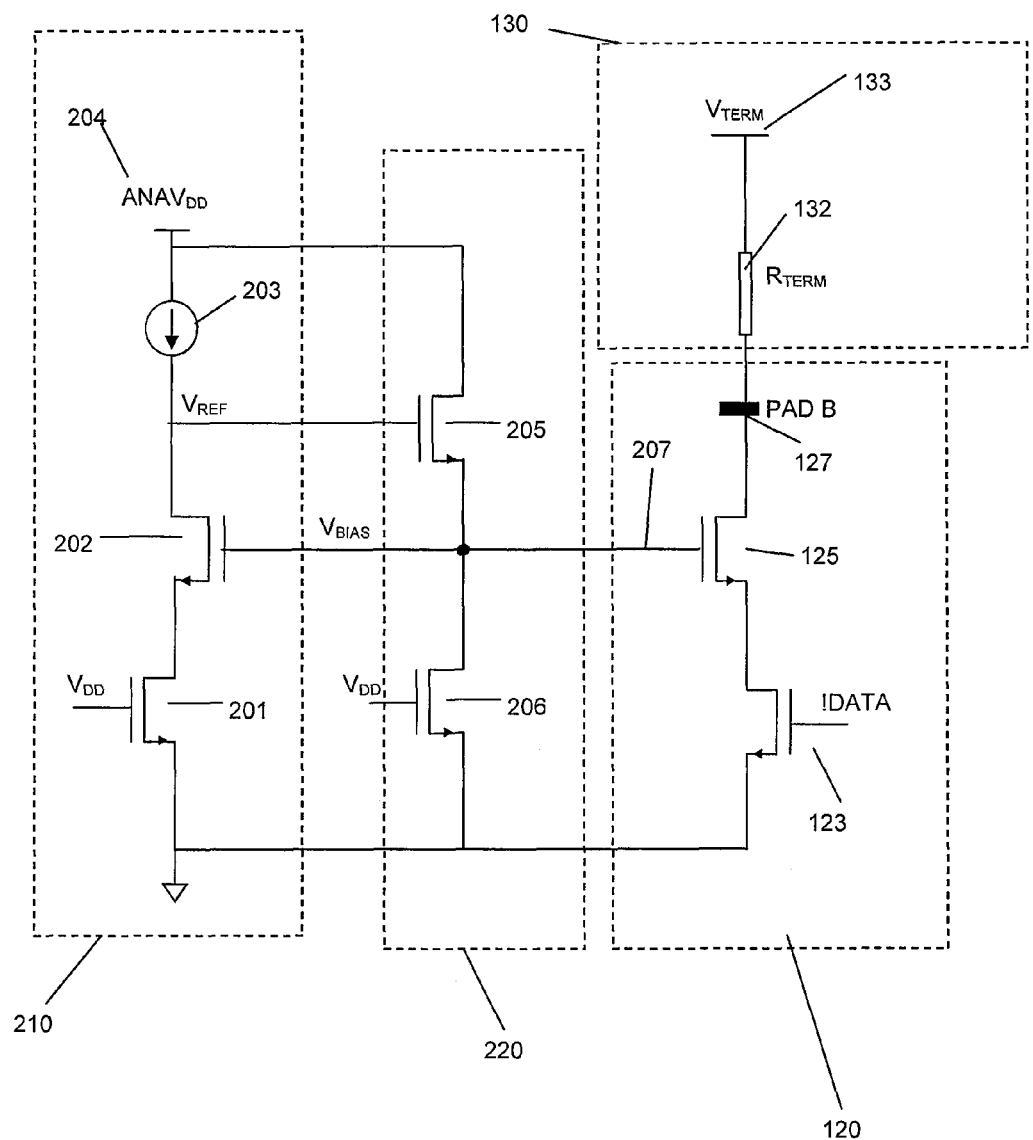
FIG. 2 shows an open drain architecture in accordance with embodiments.

FIG. 2 shows a schematic diagram of an open drain transmitter architecture in accordance with an embodiment. It will be appreciated that only a complement data input, complement data branch cascode transistor 125, output pad 127 and terminating resistor 132 have been depicted in FIG. 2. The implementation of a differential driver including in addition a data input, a data driver transistor, a data cascode transistor, output pad and terminating resistor could be implemented by a person skilled in the art and these have been omitted for simplicity.

FIG. 2 comprises biasing circuitry 210, source-follower circuitry 220, transmitter circuitry 120 and terminating receiver circuitry 130. A gate connection of a driver transistor 123 is coupled to a compliment data input and a source connection of the driver transistor 123 is coupled to ground. A drain connection of the driver transistor 123 is coupled to a source connection of a cascode transistor 125. A drain connection of the cascode transistor 125 is coupled to an output pad 127. The driver transistor 123, cascode transistor 125 and output pad 127 make up the transmitter circuitry 120. It will be appreciated that the transmitter circuitry will further comprise a second driver transistor, second cascode transistor and second output pad for the data input coupled similarly.

The output pad 127 is coupled to a terminating resistor 132 of a receiver 130. The terminating resistor 132 is coupled in series to a terminating voltage 133 of the receiver 130. The terminating resistor 132 and terminating voltage 133 form the terminating receiver circuitry 130. It will be appreciated that the terminating receiver circuitry 130 will also comprise a terminating resistor for the second output pad.

A gate of the cascode transistor 125 is coupled to a gate connection of a variable transistor 202. A source connection of the variable transistor 202 is coupled to a drain coupled of a bias transistor 201. A source connection of the bias transistor 201 is coupled to ground and a gate connection of the bias transistor 201 is coupled to a voltage VDD. A drain connection of the variable transistor 202 is coupled to a current source 203 which in turn is coupled to a voltage source VDD 204. The current source 203, variable transistor 202 and bias transistor 201 make up the biasing circuitry 210.

A drain of the variable transistor 202 is coupled to a gate connection of a source follower transistor 205. A drain of the source follower transistor 205 is coupled to the voltage supply 204. A source of the source-follower transistor 205 is coupled to the gate connection of the cascode transistor 125, the gate connection of the variable transistor 202 and a drain connection of a source follower bias transistor 206. This connection provides a biasing voltage to the cascode transistor 125. A gate connection of the source follower bias transistor 206 is coupled to the voltage source VDD and a source connection of the source follower bias transistor 206 is coupled to ground. The source follower transistor 205 and source follower bias transistor 206 make up the source-follower circuitry 220.

The driver transistor 123 may be driven by the compliment data input at its gate. The compliment data may be sufficient to switch the driver transistor 123 on and off. When the compliment data input is high the driver transistor 123 may be switched on into linear operation and a drain current is pulled from the terminal voltage 133. When the compliment data signal is low the driver transistor 123 is switched off and no current flows.

The cascode transistor 125 may set a current through the driver transistor 123. When the driver transistor is in linear operation the cascode transistor 125 is in an active or saturation mode. The bias voltage coupled to the gate of the cascode transistor 125 provides a gate source voltage for the cascode transistor which determines the drain current pulled from the terminal voltage 133 and for the driver transistor 123. The voltage drop across the gate source of the driver transistor may be the full voltage of the data compliment signal and therefore a maximum current swing is possible for the transmitter.

It will be appreciated that a differential current is pulled from the terminal voltage 133 by data signal circuitry similar to the compliment data signal circuitry of the transmitter circuitry 120.

The drain current set by cascode transistor 125 and pulled from the terminal voltage 133 may provide a voltage drop across the terminating resistor 133 and a differential voltage at the pad 127. Thus the compliment data signal and data signal circuitry (not shown) of the transmitter circuitry carries out differential signaling.

The biasing voltage on line 207 may determine the current through the cascode transistor 125. The cascode transistor 125 may form a current mirror with the variable transistor 202. The variable resistor 202 and bias transistor 201 may determine the bias provided to the cascode transistor 125 in order for the cascode transistor to set a drain current corresponding to the current through the current source 203.

In some embodiments the cascode transistor 125 and the variable transistor 202 may not be identical. For example process variation in the manufacture of the transistor may result in a mismatch between the transistors due to factors such as a difference in the channel width. Additionally the voltage source VDD in some embodiments may be subject to voltage fluctuations and may not provide a constant voltage.

In some embodiments the source-follower circuitry 220 and variable transistor 201 may be used to reduce an influence of the source voltage fluctuation and may minimize or remove a $\lambda V_{DS}$ mismatch between the cascode transistor 125 and variable transistor 202 due to respective different drain source voltages.

In some embodiments the variable transistor 202 may be tuned to increase or decrease the size of the variable transistor. For example the channel width of the variable transistor 202 may be tuned.

In some embodiments, the size of the variable transistor 202 may be tuned such that it is identical to the cascode transistor 125 at a fixed voltage. The fixed voltage may be chosen as for example an expected voltage of the voltage source VDD or an ideal voltage for that source. In some embodiments the tuning may be carried out through the use of correction codes. This may reduce a $\lambda$VDS between the cascode 125 and variable transistor 202 by reducing a channel width difference.

In embodiments the source-follower circuitry 220 may be operable to compensate for variations in the source voltage VDD. The source voltage circuitry 220 may be provided such that a voltage Vref at the drain of variable transistor 202 corresponds to the voltage of pad 127. In embodiments the drain source voltage of the cascode transistor 125 may correspond to the drain source voltage of the variable transistor 202. In this manner a ∆VDS difference between the transistors 202 and 125 may be minimized. It will be appreciated that the voltage at the pad 127 may not be exactly equal to the voltage Vref due to variations in the terminating voltage source 133 however in some embodiments these voltages may substantially equal.

Referring the source-follower circuitry 220, when the source voltage VDD increases due to for example a voltage fluctuation, the voltage providing Vbias at the gate connection of the variable transistor 202 is reduced. The bias transistor 201 may be operating in a linear mode and an increase in the gate voltage of the bias transistor 201 may result in a reduction of the drain source voltage of the bias transistor 201 to compensate for the drain current provided by the current source 203. The gate source voltage of the variable transistor 202 operating in an active mode will reduce in order to compensate for the constant current provided by the voltage source 203. Vbias is therefore reduced.

An increase in VDD may also affect the source-follower bias transistor 206 and a current through the source-follower bias transistor 206 and the source-follower transistor 205 will increase. The current increase for the source-follower circuitry may increase a gate source voltage for the source-follower transistor 205 as it is in an active mode. The reference voltage at the drain input of the variable transistor is equal to the Vbias plus the gate source voltage of the source-follower transistor and therefore may remain independent of the VDD fluctuations.

In this manner in the tuned variable transistor and source-follower circuitry may ensure that the reference voltage remains independent of VDD and in some embodiments the transistors may be sized such that the reference voltage may be set equal to the voltage at pad 127 which may reduce any $\lambda V_{DS}$ mismatch.

The behavior of the circuit of FIG. 2 may be governed in some embodiments by the equations herein.

The drain current (Ibias) through the bias transistor 201 is:

$$I\text{bias} = \beta_{M2}(VDD - VT_{M2}) \cdot Vs$$

Where $VT_{M2}$ is the threshold voltage for the bias transistor 201, Vs is the voltage at the drain input of the bias transistor 201.

$\beta$ is the transistor coefficient and is equal to $\mu nCoxW/L$ where $\mu n$ is a charge carrier effective mobility, Cox is the gate oxide capacitance per unit area and W/L is the gate length of the transistor. It will be appreciated that this definition of $\beta$ is applicable to all of the transistors.

The voltage at the drain connection of the bias transistor 201 is therefore:

$$Vs = I\text{bias}/[\beta_{M2} \cdot (VDD - VT_{M2})] \quad (1)$$

The current set through the variable transistor 202 and identical to the current through the bias transistor 201 may be:

$$I\text{bias} = \beta_{M1}/2 \cdot (V_{BIAS} - Vs - VT_{M1})^2$$

Where is the threshold voltage for the variable transistor 202. Vbias may therefore be defined by:

$$V_{BIAS} - Vs - VT_{M1} = \sqrt{[(2 \times I\text{bias})/\beta_{M1}]}$$

$$V_{BIAS} = Vs + VT_{M1} + \sqrt{[(2 \times I\text{bias})/\beta_{M1}]}$$

Replacing Vs from (1)

$$V_{BIAS} = I\text{bias}/[\beta_{M2} \cdot (VDD - VT_{M2})] + VT_{M1} + \sqrt{[(2 \times I\text{bias})/\beta m1]} \quad (2)$$

The current through the source-follower bias transistor 206 of the source follower circuitry 220 may be given by:

$$IDS = \beta_{M3}/2 \cdot (VDD - VT_{M3})^2$$

Where $VT_{M3}$ is the threshold voltage for the source-follower bias transistor 206.

The current through the source follower transistor 205 is equal to the current through the source-follower bias transistor 206 may be given by:

$$IDS = \beta_{M4}/2 \cdot (VREF - V\text{bias} - VT_{M4})^2 \Rightarrow \beta_{M3}/2 \cdot (VDD - VT_{M3})^2 = \beta_{M4}/2 \cdot (VREF - V\text{bias} - VT_{M4})^2$$

Where $VT_{M4}$ is the threshold voltage of the source follower transistor 205.

Therefore the reference voltage may be given by:

$$VREF = V\text{bias} + VT_{M4} + (VDD - VT_{M3}) \cdot \sqrt{(\beta_{M3}/\beta_{M4})}$$

Replacing Vbias from (2)

$$VREF = I\text{bias}/[\beta_{M2} \cdot (VDD - VT_{M2})] + VT_{M1} + \sqrt{[(2 \times I\text{bias})/\beta_{M1}]} + VT_{M4} + (VDD - VT_{M3}) \cdot \sqrt{(\beta_{M3}/\beta_{M4})}$$

Let, $$K1 = I\text{bias}/\beta_{M2}$$

$$k2 = \sqrt{(\beta_{M3}/\beta_{M4})},$$

$$k3 = VT_{M1} + \sqrt{[(2 \times I\text{bias})/\beta_{M1}]} + VT_{M4}$$

Therefore the Vref is:

$$VREF = k1/(VDD - VT_{M2}) + k2 \cdot (VDD - VT_{M3}) + k3$$

Let $VT_{M2}=VT_{M3}$ and $VDD-VT_{M2}=u$ $$\partial VREF/\partial u = -k1/u^2 + k2$$

If $u=\sqrt{(k1/k2)}$ VREF is independent of the fluctuation of VDD for a limited variation.

Figure 3:
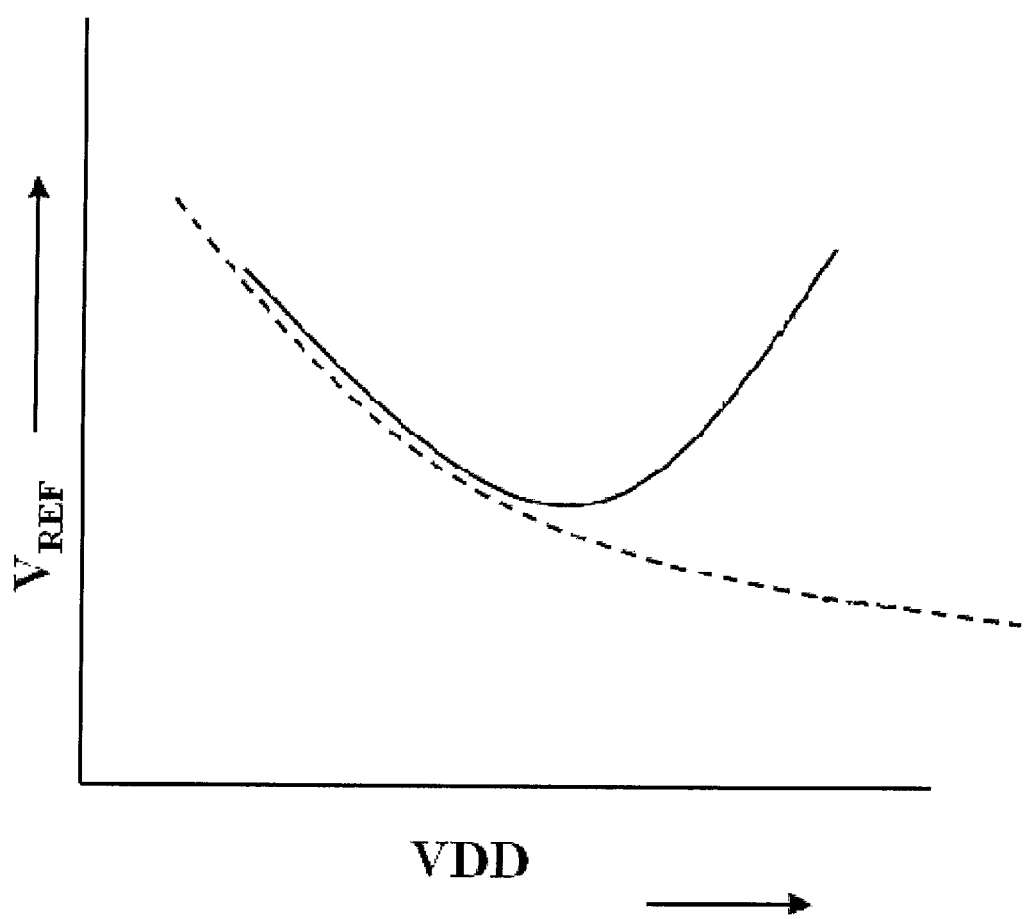
FIG. 3 shows a graph of the relationship between the reference voltage and source voltage.

Therefore embodiments may provide a reference voltage to be independent of the source voltage VDD for a limited variation as shown in FIG. 3. FIG. 3 shows the plot of the source voltage VDD against the reference voltage Vref. The dashed line indicates a plot of the reference voltage against the source voltage 4 in an open drain transmitter according to the prior art. The solid line indicates the relationship according to embodiments. Embodiments may provide a substantially independent relationship between the reference voltage and the source voltage for a limited variation of VDD. In some embodiments the limited expected variation of VDD may falls within this limited variation.

While this detailed description has set forth embodiments of the invention, the appended claims cover other embodiments which differ from the described embodiments according to various modifications and improvements. Other applications and configurations may be apparent to the person skilled in the art.

I claim:

1. A circuit comprising:
    transmitting circuitry configured to output a differential signal;
    biasing circuitry configured to provide a bias signal to the transmitting circuitry; and
    control circuitry configured to adjust a drain voltage of the biasing circuitry responsive to a voltage source of the circuit,
    wherein the circuit comprises an all N-channel circuit and the control circuitry comprises:
    a first transistor driven by the voltage source; and
    a second transistor driven by the drain voltage of the biasing circuitry, the first and second transistor being further coupled to the bias signal.

2. The circuit of claim 1 wherein the drain voltage is substantially constant.

3. The circuit of claim 1 wherein the control circuitry is further configured to monitor the voltage source.

4. The circuit of claim 1 wherein the control circuitry comprises source-follower circuitry.

5. The circuit of claim 1 wherein the biasing circuitry comprises:
    a variable transistor,
    wherein the drain voltage is a drain voltage of the variable transistor.

6. The circuit of claim 5 wherein the variable transistor is adjusted such that the drain voltage of the variable transistor is substantially equal to a drain voltage of a current setting transistor.

7. The circuit claim 1 wherein the transmitting circuitry comprises:
    a current setting transistor,
    wherein the bias signal biases the current setting transistor.

8. The circuit of claim 7 wherein the current setting transistor is configured to provide a drive current determined by a drive current of the biasing circuitry.

9. The circuit of claim 8 wherein the drive current of the transmitting circuitry is substantially equal to the drive current of the biasing circuitry.

10. The circuit of claim 1 wherein the bias circuit comprises:
    a variable transistor;
    a second transistor driven by the voltage source, the second transistor coupled to ground and to the variable transistor; and
    a current source configured to provide a drive current to the variable and second transistor.

11. The circuit of claim 1 wherein the transmitting circuitry comprises:
    a differential transistor driven by an input differential signal; and
    a cascode transistor driven by the bias signal for providing a bias current to the differential transistor,
    wherein the differential transistor is coupled to the cascode transistor and ground.

12. The circuit of claim 11 wherein the cascode transistor pair comprises a current setting transistor.

13. The circuit of claim 1 wherein the circuit comprises a transmitter.

14. A switching circuit comprising:
    a source follower current mirror having an input, an output, a first source terminal, a bias terminal, and a second source terminal;
    a current source coupled to the input of the current mirror;
    an output terminal coupled to the output of the current mirror;
    a first bias transistor coupled to the first source terminal;
    a second bias transistor coupled to bias terminal of the current mirror; and
    a driver transistor coupled to the second source terminal,
    wherein the switching circuit comprises an all N-channel switching circuit.

15. The switching circuit of claim 14, wherein the source follower current mirror comprises:
    a first transistor having a drain coupled to the input, a gate coupled to the bias terminal, and a source coupled to the first source terminal;
    a second transistor having a drain coupled to the output, a gate coupled to the bias terminal, and a source coupled to the second source terminal; and
    a third transistor having a drain coupled to a source of supply voltage, a gate coupled to the input, and a source coupled to the bias terminal.

16. The switching circuit of claim 15, wherein the first transistor is sized such that the input voltage is substantially independent of the supply voltage.

17. A circuit comprising:
    transmitting circuitry configured to output a differential signal;
    biasing circuitry configured to provide a bias signal to the transmitting circuitry; and
    control circuitry configured to adjust a drain voltage of the biasing circuitry responsive to a voltage source of the circuit,
    wherein the circuit comprises an all N-channel circuit, the biasing circuitry comprises a variable transistor, the drain voltage is a drain voltage of the variable transistor, and the variable transistor is adjusted such that the drain voltage of the variable transistor is substantially equal to a drain voltage of a current setting transistor.

18. A circuit comprising:
    transmitting circuitry configured to output a differential signal;
    biasing circuitry configured to provide a bias signal to the transmitting circuitry; and
    control circuitry configured to adjust a drain voltage of the biasing circuitry responsive to a voltage source of the circuit, wherein the circuit comprises an all N-channel circuit, the transmitting circuitry comprises a current setting transistor, the bias signal biases the current setting transistor, the current setting transistor is configured to provide a drive current determined by a drive current of the biasing circuitry, and the drive current of the transmitting circuitry is substantially equal to the drive current of the biasing circuitry.

19. A circuit comprising:

transmitting circuitry configured to output a differential signal;

biasing circuitry configured to provide a bias signal to the transmitting circuitry; and control circuitry configured to adjust a drain voltage of the biasing circuitry responsive to a voltage source of the circuit, wherein the circuit comprises an all N-channel circuit and the bias circuit comprises:

a variable transistor;

a second transistor driven by the voltage source, the second transistor coupled to ground and to the variable transistor; and a current source configured to provide a drive current to the variable and second transistor.

* * * * *